United States Patent
Xi

(10) Patent No.: US 7,120,066 B2
(45) Date of Patent: Oct. 10, 2006

(54) MEMORY DEVICE FOR MULTIPLEXING INPUT AND OUTPUT OPERATION

(75) Inventor: Sung Soo Xi, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/878,327

(22) Filed: Jun. 29, 2004

(65) Prior Publication Data

US 2005/0226057 A1    Oct. 13, 2005

(30) Foreign Application Priority Data

Mar. 31, 2004    (KR) .................. 10-2004-0022070

(51) Int. Cl.
*G11C 7/00* (2006.01)

(52) U.S. Cl. .................. 365/189.02; 365/189.07; 365/189.05

(58) Field of Classification Search ............... None
See application file for complete search history.

(56) References Cited

U.S. PATENT DOCUMENTS

| 5,617,350 | A | * | 4/1997 | Roohparvar | 365/185.02 |
| 6,320,794 | B1 | * | 11/2001 | Kang et al. | 365/189.02 |
| 6,590,829 | B1 | * | 7/2003 | Takeuchi | 365/233.5 |
| 6,762,963 | B1 | * | 7/2004 | Inoue et al. | 365/200 |

* cited by examiner

*Primary Examiner*—Thong Q. Le
(74) *Attorney, Agent, or Firm*—Heller Ehrman LLP

(57) ABSTRACT

A memory device for multiplexing an input/output operation prevents mis-operations by comparing the input addresses with the output data and improves operating speed by activating data corresponding to the input addresses by input address toggle. The memory device for multiplexing an input/output operation comprises an data output buffer, an address buffer, a comparison unit and a row activation control unit. The comparison unit compares an address outputted from the address buffer to the address bus with data inputted through the output data bus to the data output buffer, and outputs the comparison result. The row activation control unit generates a row active signal for activating a row path in response to the comparison result.

7 Claims, 1 Drawing Sheet

MEMORY DEVICE FOR MULTIPLEXING INPUT AND OUTPUT OPERATION

BACKGROUND OF THE INVENTION

1. Field of the Invention

The present invention generally relates to a memory device for multiplexing an input/output operation, and more specifically, to a memory device for multiplexing an input/output operation which prevents mis-operations by comparing the input addresses with the output data and improves operating speed by toggling input address to activate data corresponding to the input address if a valid address input detection signal is inputted late.

2. Description of the Prior Art

In general, a memory device becomes highly integrated and a chip size also becomes smaller.

For instance, since an input/output pad occupies a large area in the memory device, output data and input signals including input data and input addresses are multiplexed in order to reduce the number of input/output pads.

When the memory device multiplexes input/output operations, a valid address input detection signal is additionally used which becomes the basis of all timing.

As a result, when an address is toggled earlier than the address valid bar signal, an input address is recognized as invalid since a conventional art does not receive the input address before the address valid bar signal is activated.

When the address is toggled earlier than the address valid bar signal, the input address is recognized as valid and output data are also recognized as the input addresses, which results in large power consumption due to unnecessary operations and in mis-operations of the memory device.

In other words, when the memory device performs a asynchronous operation, all timing specification is set when an address is transitioned. As a result, when output data and an input address are not specified, output data are transmitted to an address buffer since the input address and the output data share an external data bus, and the memory device performs unnecessary operation due to the operation of the address buffer caused toggle of the output data, thereby causing unnecessary power consumption.

SUMMARY OF THE INVENTION

It is an object of the present invention to prevent mis-operations resulting from mis-recognition of output data as input address by comparing the input address with the output data.

It is another object of the present invention to perform high-speed operation by activating data corresponding to input address when output data are different from the input address.

In an embodiment, a memory device for multiplexing an input/output operation comprises a data output buffer, an address buffer, a comparison unit and a row activation control unit. The data output buffer buffers data of an output data bus at a read mode and outputs the buffered data to an external data bus. The address buffer buffers address of the external data bus and outputs the buffered data to an address bus. The comparison unit compares an address outputted from the address buffer to the address bus with data inputted through the output data bus to the data output buffer, and outputs the comparison result to a comparison data bus. The row activation control unit generates a row active signal for activating a row path in response to an output signal from the comparison unit.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

Figure 1:
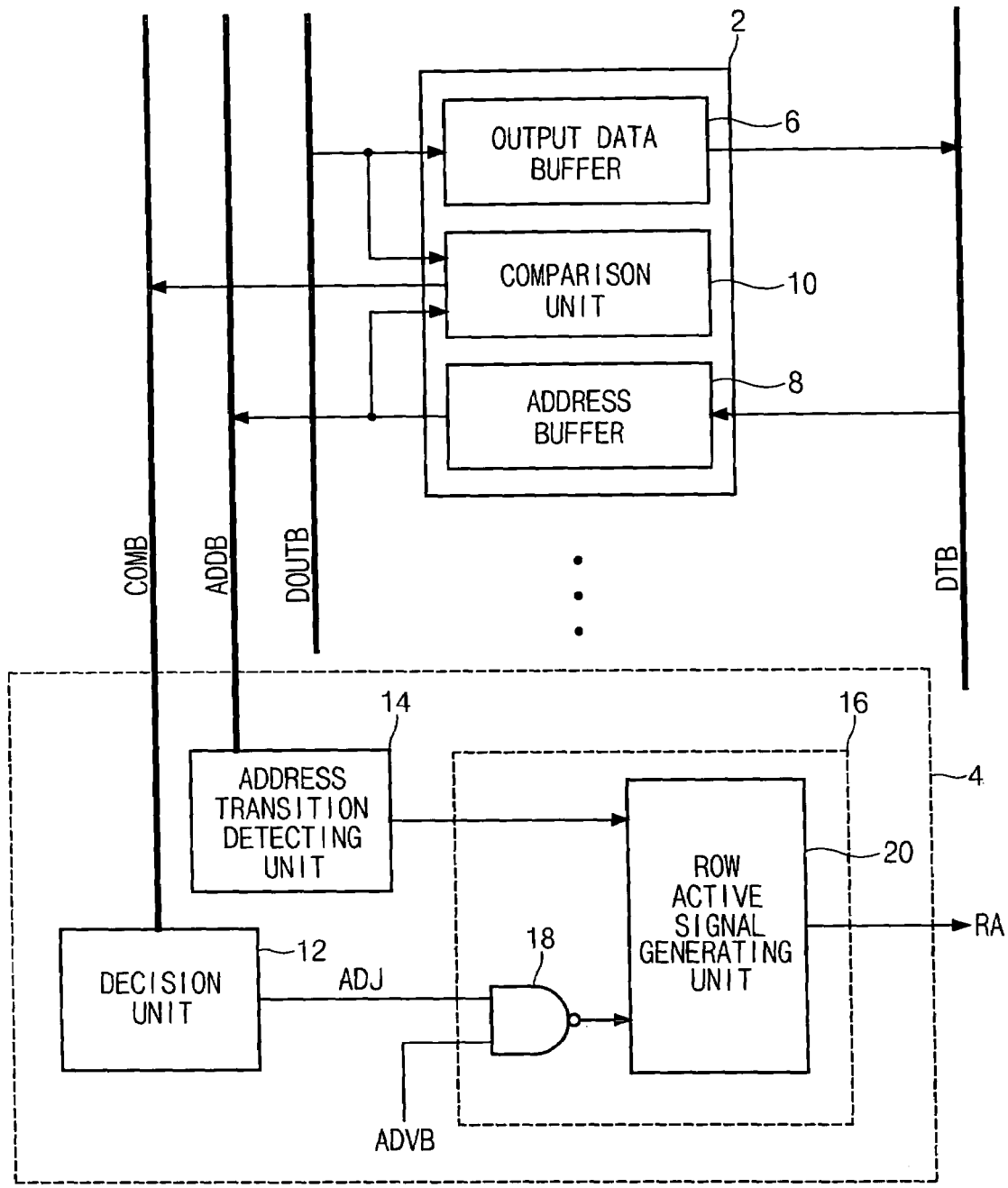
FIG. 1 is a block diagram of a memory device for multiplexing an input/output operation according to an embodiment of the present invention.

The present invention will be described in detail with reference to the accompanying drawings.

FIG. 1 is a block diagram of a memory device for multiplexing an input/output operation according to an embodiment of the present invention.

In an embodiment, the memory device comprises an address bus ADDB, an output data bus DOUTB, an external data bus DTB, a comparison data bus COMB, a plurality of buffer blocks 2 and a control block 4.

The buffer block 2 comprises a data output buffer 6, an address buffer 8 and a comparison unit 10.

The data output buffer 6 buffers data of the output data bus DOUTB at a read mode, and outputs the buffered data to the external data bus DTB.

The address buffer 8 buffers an externally inputted address through the external data bus DTB, and outputs the buffered address to the address bus ADDB.

The comparison unit 10 compares the address outputted from the address buffer 8 to the address bus ADDB with the data inputted through the output data bus DOUTB to the data output buffer 6, and outputs the comparison result to the comparison data bus COMB.

Meanwhile, the control block 4 comprises a decision unit 12, an address transition detecting unit 14 and a row activation control unit 16.

The decision unit 12 decides whether data on the comparison data bus COMB are all identical.

The address transition detecting unit 14 detects when addresses on the address bus ADDB are transitioned.

The row activation control unit 16 comprises a NAND gate 18 and a row active signal generating unit 20. Here, the row activation control unit 16 performs a NAND operation on an output signal ADJ from the decision unit 12 and a data valid bar signal ADVB. The row active signal generating unit 20 is controlled by an output signal from the NAND gate 18 and an output signal ATDSUM from the address transition detecting unit 14, and generates a row active signal RA for activating a row path.

AS a result, the row active signal generating unit 20 sets earlier activated one of the address valid bar signal ADVB or an address as the whole reference signal when the output data inputted to the data output buffer 6 are different from the input address outputted from the address buffer 8, thereby improving the operating speed of the memory device.

Meanwhile, the row active signal generating unit 20 blocks the row active signal RA outputted from the row activation control unit 16 in response to the output signal from the NAND gate 18 regardless of the address valid bar signal ADVB when the output data inputted to the data output buffer 6 is identical with the input address outputted from the address buffer 8.

As described above, a memory device for multiplexing an input/output operation according to an embodiment of the present invention can prevent mis-operations resulting from mis-recognition of output data as input addresses by comparing the output data with the input addresses.

Additionally, when output data are different from addresses, toggling input address to activate data corresponding to the input address if an address valid bar signal ADVB is inputted late can perform high-speed operation.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device for multiplexing an input/output operation, comprising:
   a plurality of data output buffers each buffering data of an output data bus at a read mode and outputting the buffered data to an external data bus;
   a plurality of address buffers each buffering an address of the external data bus and outputting the buffered address to an address bus;
   a plurality of comparison units each comparing an address outputted from one of the plurality of address buffers to the address bus with data inputted through the output data bus to the respective one of the plurality of data output buffers, and outputting a plurality of comparison results, respectively; and
   a row activation control unit for generating a row active signal which selectively activates a row path in response to the plurality of comparison results.

2. The memory device according to claim 1, further comprising a decision unit for deciding whether the plurality of comparison results are identical and outputting a decision result to the row activation control unit.

3. The memory device according to claim 2, further comprising an activating unit for activating the row activation control unit when one of the decision result and a valid address input detection signal is activated.

4. The memory device according to claim 3, wherein the activating unit is a NAND gate.

5. The memory device according to claim 2, wherein the row activation control unit blocks the row active signal in response to the decision result when the plurality of comparison results are identical.

6. The memory device according to claim 1, further comprising an address transition detecting unit for detecting when addresses of the address bus are transitioned.

7. The memory device according to claim 6, wherein the row activation control unit generates the row active signal in response to a signal which is activated earlier of the valid address input detection signal and the output signal from the address transition detecting unit when data inputted through the output data bus to one of the plurality of data output buffers is not identical with an address outputted from the respective one of the plurality of address buffers to the address bus.

* * * * *